United States Patent [19]

Kendall

[11] 4,455,524
[45] Jun. 19, 1984

[54] BATTERY CONDITION INDICATOR

[75] Inventor: Paul A. Kendall, 4615 Saul Rd., Kensington, Md. 20795

[73] Assignee: Paul A. Kendall, Kensington, Md.

[21] Appl. No.: 431,721

[22] Filed: Sep. 30, 1982

[51] Int. Cl.³ .............................................. H02J 7/00
[52] U.S. Cl. .................................... 320/48; 340/636
[58] Field of Search ........................... 320/48; 340/636

[56] References Cited
U.S. PATENT DOCUMENTS

| | | | |
|---|---|---|---|
| 4,132,942 | 1/1979 | Yamamoto | 340/636 |
| 4,203,065 | 5/1980 | Whitford | 320/48 |
| 4,329,406 | 5/1982 | Dahl et al. | 320/48 |

Primary Examiner—William M. Shoop
Assistant Examiner—Anita M. Ault
Attorney, Agent, or Firm—Brady, O'Boyle & Gates

[57] ABSTRACT

The charge state of a storage battery, such as a lead sulphuric acid battery, is monitored by a continuous flow hydrodynamic indicator system which includes a barrier to the movement of bubbles into the electrolyte column of the indicator system during battery charging. Clogging of the column and resulting interference with the operation of the indicator system is avoided. A digital buoyant and sunk ball indicator is used in conjunction with a binary counting circuit.

12 Claims, 11 Drawing Figures

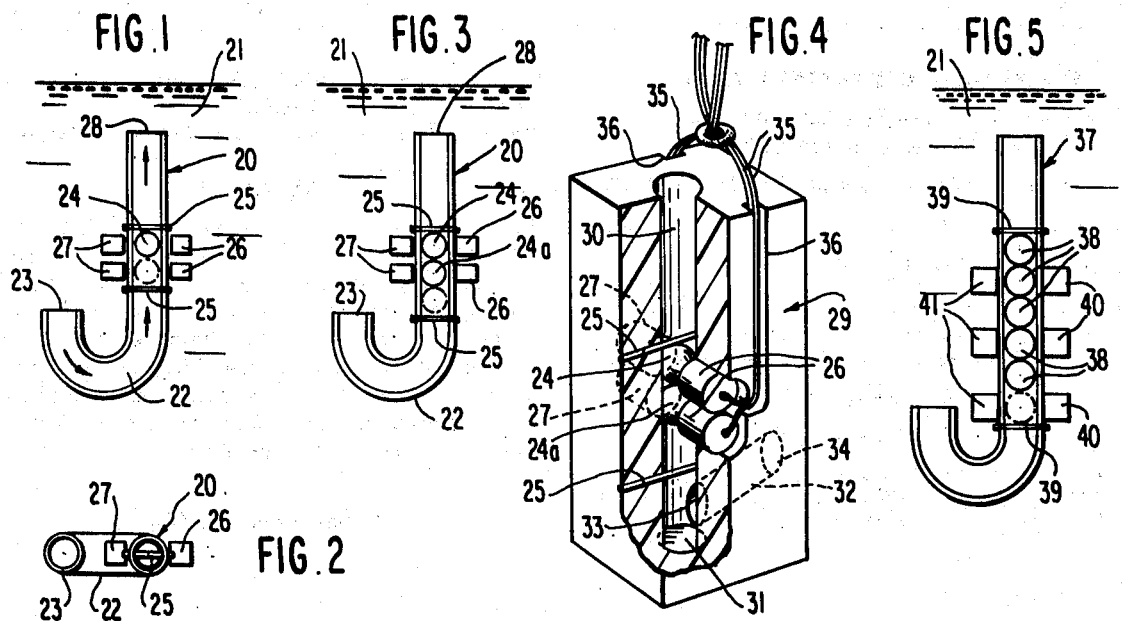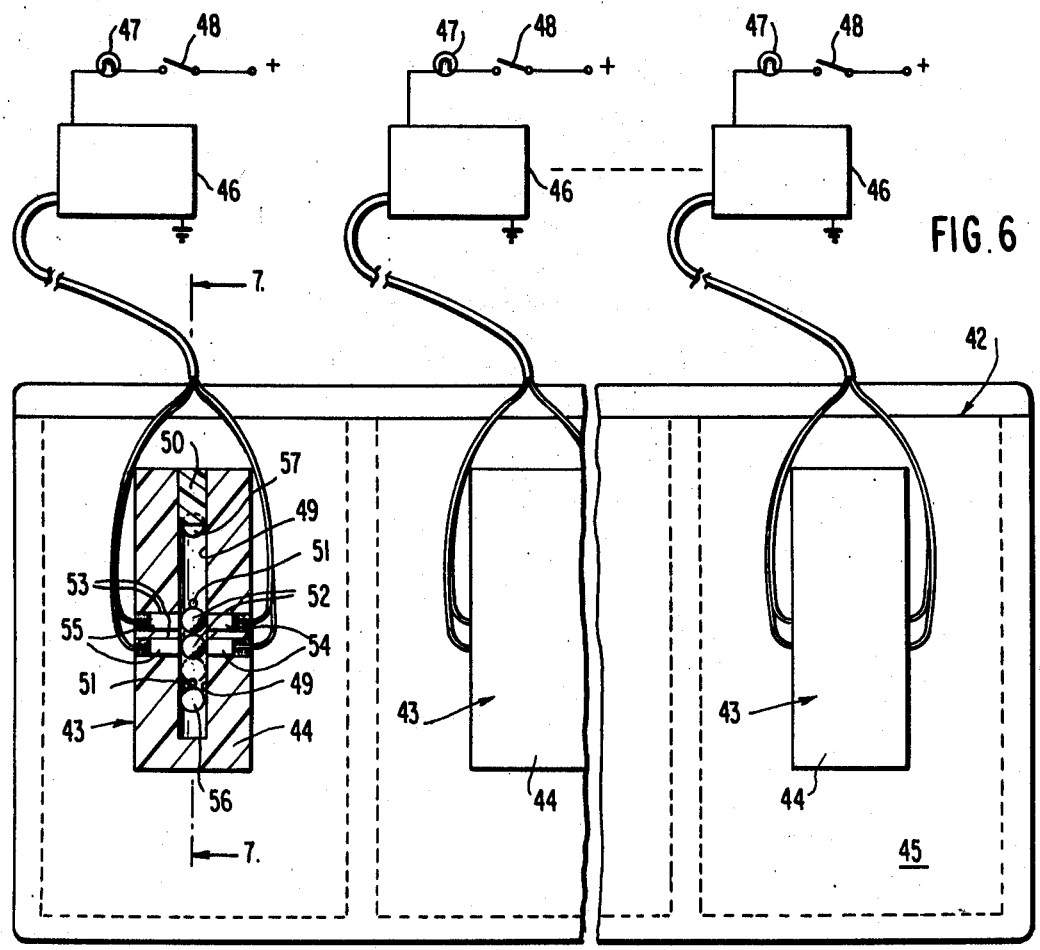

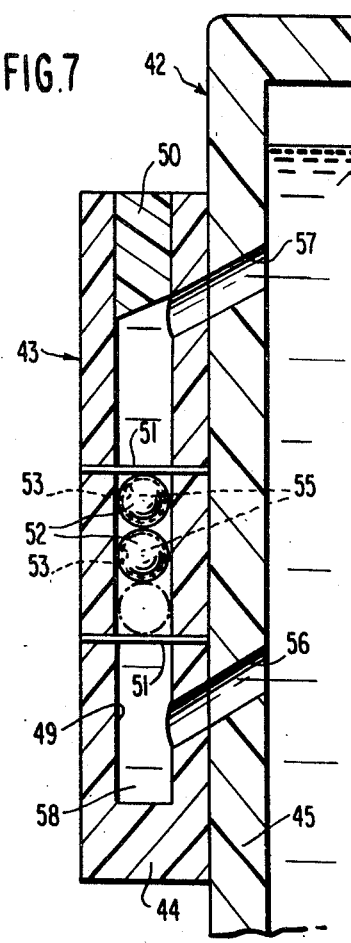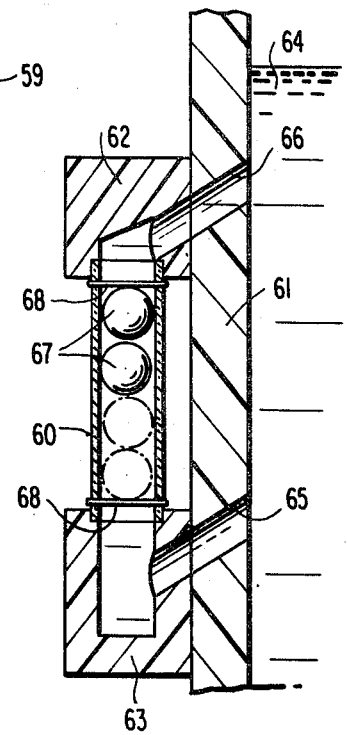

BATTERY CONDITION INDICATOR

The invention described herein may be manufactured, used and licensed by or for the Government for Governmental purposes without the payment to me of any royalties thereon.

BACKGROUND OF THE INVENTION

This invention seeks to satisfy a need for a device which can monitor and indicate the state of the charge of a lead acid battery with increased accuracy and sensitivity. The monitor and indicator according to this invention is of the type which responds constantly and promptly to extremely minute changes in specific gravity of the battery liquid electrolyte during charging and discharging of the battery.

Heretofore, specific gravity monitors and indicators for batteries have been hydrostatic systems which tend to be slow in their response to changes in specific gravity of the electrolyte. Furthermore, fluid movement in these hydrostatic indicating systems tends to be extremely slow because of reliance on slow diffusion for operation.

Another serious drawback in the prior art is the lack of any provision for excluding bubbles constantly generated in the electrolyte during charging from entering and clogging the indicator liquid column, thereby retarding, and, in some cases, completely disabling a movable indicator element in the column, such as a float.

In substantially completely eliminating the above and other known deficiencies of the prior art, the present invention provides a battery condition indicator which can be readily built into a commercial lead acid storage battery to continuously monitor and indicate the state of the charge on the battery in response to changes in specific gravity of the battery electrolyte over an extremely narrow range.

The improved accuracy and sensitivity of the indicating system for batteries is achieved by the utilization of a simple continuous flow arrangement for the liquid electrolyte, which includes an effective barrier to the induction of bubbles contained in the electrolyte into the electrolyte column or passage of the indicator, whereby such bubbles are prevented from clogging the indicator in whole or in part. In essence, the present invention makes use of a hydrodynamic indicator system as distinguished from the much more sluggish hydrostatic systems in the prior art.

In a preferred form, the invention utilizes an indicator vertical column for liquid electrolyte having at least a bottom bubble-excluding entrance. At least one buoyant or sunk float is contained in the electrolyte column between submerged spaced stops which are positioned relative to electro-optical emitterdetectors to enable a digital indicating response to the movement of the float to or from the buoyant and sunk positions following changes in specific gravity of the electrolyte over a very narrow range. The interruption of the optical path between emitter and detector elements of the indicator caused by the rise or fall of the float can produce a digital response through a state-of-the-art binary counting circuit connected with the emitter and detector elements and having a suitable display.

Variations in the construction of the indicator and additional features and advantages thereof over the prior art will become apparent during the course of the following detailed description.

BRIEF DESCRIPTION OF THE DRAWINGS

FIG. 1 is a partly schematic side elevation of a battery condition indicator according to the present invention.

FIG. 2 is a plan view of the indicator in FIG. 1.

FIG. 3 is a partly schematic side elevation of an indicator in accordance with a modified embodiment of the invention.

FIG. 4 is a perspective view, partly in section, showing a portable tethered indicator in accordance with another modified embodiment.

FIG. 5 is a side elevation, similar to FIGS. 1 and 3, showing still another embodiment of the invention.

FIG. 6 is a partly schematic side elevation of a storage battery and indicator means for the cells thereof according to the invention, partly broken away and partly in section.

FIG. 7 is an enlarged fragmentary vertical section taken on line 7—7 of FIG. 6.

FIG. 8 is a similar cross sectional view showing a modification of the invention constructed for direct visual reading.

FIG. 9 is a fragmentary side elevation, partly in cross section, of a storage battery having an indicator according to the invention common to two battery cells.

FIG. 10 is an enlarged fragmentary vertical section taken on line 10—10 of FIG. 9.

FIG. 11 is a view similar to FIG. 9 showing another modification.

DETAILED DESCRIPTION

Referring to the drawings in detail like numerals designate like parts, and referring first to FIG. 1, a simplified embodiment of the invention comprises a J-tube 20 completely submerged in the liquid electrolyte 21 of a battery, such as a lead sulphuric acid battery, the details of which are well known, and are omitted from the drawings. The long branch of the J-tube 20 is vertically positioned in the battery and its bight 22 is arranged lowermost with the entrance 23 to the bight 22 facing upwardly, as shown. A single ball 24 of known precise specific gravity is disposed movably in the bore of J-tube 20 and is held between two spaced stop pins 25 supported on the long branch of the J-tube and extending diametrically across its bore in parallel relationship.

On diametrically opposite sides of the J-tube long branch, above the entrance 23 and between stop pins 25, are electrooptical detectors 26 and emitters 27 of types well known in the art. These elements are adapted to be connected with a state-of-the-art binary counting circuit means, not shown in FIG. 1, including a suitable display indicative of the state of the charge of the storage battery.

The bore of the J-tube 20 is completely flooded and the ball 24 of precise specific gravity, plus or minus approximately 0.005, is submerged in the liquid electrolyte 21 at all times. As the specific gravity of the electrolyte changes, such as between full charge and fractional charge or no charge, the ball 24 will always be either buoyant and in contact with the upper stop pin 25, or sunk and in contact with the lower stop pin 25. In either of these positions, the ball will lie squarely between one pair of the electro-optical elements 26 and 27 so as to completely block the optical path between the elements. The optical path between the other pair of elements 26 and 27 will then be completely unblocked.

In a practical embodiment of the invention, the specific gravity of the battery electrolyte 21 may be 1.280 at full charge. The specific gravity may be 1.170 at no charge, and 1.250 at three-quarter charge. The sensitivity of the ball 24 at ±0.005 SG is more than adequate to indicate a three-quarter full charge battery state, a one-half or a one-quarter charge state. In fact, the ball is sufficiently sensitive to changes in electrolyte specific gravity to respond to much narrower incremental changes in battery electrolyte specific gravity should this be desired.

Depending upon the state of each detector 26, either cut off or saturated, the movement of the ball 24 to one of its two possible positions, buoyant or sunk, will, on the one hand, block the optical path between diametrically opposing elements 26 and 27, and, on the other hand, leave the optical path uninterrupted for producing a digital output or no output in the associated binary counting circuit, as the case may be. It can be seen that in the described battery condition indicator the submerged ball 24 moves precisely one ball diameter in the bore of the J-tube between its buoyant and sunk positions, the electro-optical axes of the paired elements 26 and 27 being one ball diameter apart, and the stop pins 25 being two ball diameters apart.

During the operation of the battery condition indicator, there is a continuous flow of the electrolyte 21 through the J-tube 20 from the entrance 23 of the bight 22 and upwardly through the long branch to the top exit 28 thereof. This continuous flow is due to differential pressure existing between the ends of the J-tube. This hydrodynamic action of the indicator renders it much more responsive than prior art hydrostatic types lacking continuous flow of the electrolyte, and relying on slow diffusion.

When the battery is charging, small bubbles, not shown, are continuously being formed in the electrolyte and are rising to its surface. If these bubbles can enter the liquid column defined by the long vertical branch of the J-tube, they can cling to the wall of such branch and/or to the ball 24 and impede or completely block the movement of the ball by a strong clogging action. Such bubble clogging is a very objectionable phenomenon in the prior art. It is completely avoided in the invention due to the fact that the upwardly facing entrance of the bight 22 of the J-tube comprises an effective barrier to the movement of any of the rising bubbles into and through the J-tube. The rising bubbles simply move past and above the entrance 23 and thus cannot enter the J-tube without reversing their direction of movement, which is impossible.

During battery discharge, there is a very slight continuous flow of electrolyte in the opposite direction, that is, downwardly through the long branch of the J-tube 20. However, during discharge, the formation of bubbles in the electrolyte is almost insignificant, and is not sufficient to cause any clogging action with respect to the ball 24. Hence, the battery condition indicator, as described, is extremely sensitive and responsive and constitutes a significant advance in terms of improved mode of operation over the prior art.

FIG. 3 shows a modified embodiment which differs from the arrangement in FIGS. 1 and 2 only in that two movable balls 24 and 24a of slightly different specific gravities are employed instead of a single ball. The stop pins 25 on the J-tube 20 are now spaced three ball diameters apart so that one ball or both balls can move one ball diameter in the long branch of the J-tube upwardly or downwardly, depending upon electrolyte specific gravity changes. The placement of the electro-optical elements 26 and 27 relative to the J-tube 20 and top stop pin 25 is unchanged in FIG. 3 and, except for relocation of the lower stop pin and the provision of two movement balls, the battery condition indicator shown in FIG. 3 is identical to that shown in FIG. 1 and operates in substantially the same manner.

For example, with the battery at full charge, the two balls 24 and 24a are buoyant and blocking both optical paths to the detector elements 26. Depending on the states of these elements, the binary counting circuit associated with them, not shown, can produce one or two digital outputs or no outputs to properly indicate the condition of the battery on a suitable dashboard display or the like.

When the battery drops to a fractional charge, such as three-quarters of full charge, the specific gravity of ball 24a can be selected to sink at this time into contact with stop pin 25 while the ball 24 remains buoyant. The resulting opening of the optical path between the lower pair of elements 26 and 27 can produce an output in the binary counting circuit indicative of the change. When the battery charge diminishes still further, say to one-half charge, the resulting drop in specific gravity of the electrolyte 21 can produce sinking of the ball 24 on top of the already sunk ball 24a to clear the optical path between the upper two elements 26 and 27, resulting in a further indication of battery condition through the associated counting circuit. In such a case, the specific gravity of the ball 24 is pre-chosen to enable the ball to sink in response to a very precise drop in the specific gravity of the electrolyte. Many variations in the type of display produced by the indicator can be achieved by changing the state of the detector elements 26, as is well known. It will be noted that, as in the prior form of the invention shown in FIG. 1, the balls 24 and 24a move individually or in unison only one complete ball diameter within the J-tube 20.

FIG. 4 shows an embodiment of the invention which functions in the manner described for the embodiment in FIG. 3, except that the battery condition indicator is portable and tethered so that it can be lowered into the electrolyte of a large battery to give an indication of battery condition in terms of its charge, and then raised and removed from the battery.

In lieu of the fixed submerged J-tube 20, a portable block 29 has a vertical bore 30 opening through its top and thus corresponds to the long vertical branch of the J-tube. The lower end of the bore 30 is closed as at 31. A steeply inclined branch bore 32 intersects the vertical bore 30 at 33 near its lower end and rises from this point and opens through one side wall of the block 29, as indicated at 34. This opening at an elevation well above the intersecting point 33 forms the same type of bubble barrier provided by the bight 22 and its upwardly facing entrance 23 on the J-tube 20. Thus, the two bores 30 and 32 in a functional sense within the block 29 are the full equivalent of the J-tube 20.

The two stop pins 25 are provided across the bore 30 in the same relative positions and for the same purpose as the corresponding pins in FIG. 3. The relationship of the two balls 24 and 24a is unchanged in FIG. 4 as is the arrangement of the electro-optical elements 26 and 27 which are installed in suitable openings in the block 29. The wires 35 leading from the electrooptical elements 26 and 27 and connected in a remote counting circuit, not shown, form a tether for the portable indicator and may be received within stabilizing grooves 36 formed in opposite faces of the block 29.

The mode of operation of the portable tethered indicator is the same as previously-described relative to the indicator in FIG. 3.

FIG. 5 illustrates a further variation of the battery condition indicator in FIG. 1. A submerged J-tube 37 is employed containing in its long vertical branch five equal diameter balls 38 whose specific values are individually different and very precisely chosen. The five balls 38 are captured between two stop pins 39 across the bore of the long vertical branch of the J-tube. The two pins 39 are spaced apart a distance equal to six diameters of one of the balls 38. In some cases, an even larger number of balls having equal diameters could be employed in the indicator. In any case, the spacing of the two stop pins 39 will always equal the number of balls used times the ball diameter plus one ball diameter, so that a digital mode of operation is obtained in terms of ball movement relative to the electro-optical detector-emitter means. However, in multiball systems having a substantially large number of balls, to minimize the number of detector-emitter pairs, more than one ball diameter of movement is required.

As in prior embodiments, the balls 38 are either buoyant or sunk in liquid electrolyte 21 dependent upon minute changes in specific gravity of the electrolyte as previously-described.

Three opposing pairs of detectors 40 and emitters 41 are provided, and the pairs are spaced apart equidistantly on the long branch of the J-tube 37 with the topmost pair spaced one ball diameter below the top stop pin 39 and the bottom-most pair at the level of the lower stop pin. The states of detectors 40 may be controlled and individually established, turned off or saturated, as previously explained, to produce different patterns of digital outputs in the associated conventional counting circuit, not shown, so as to indicate incremental changes in the state of the charge of the battery containing the indicator.

For example, with a full charge on the battery and maximum specific gravity for the electrolyte 21, all five balls 38 may be buoyant as shown in FIG. 5 with the top ball against the top stop pin 39. When the battery charge diminishes by a small fraction, the lowermost ball 38 may have its specific gravity chosen to sink against the bottom pin 39 as shown in broken lines in FIG. 5, to thereby interrupt the optical path between the bottom pair of detector-emitter elements 40 and 41. Depending upon the state of the element 40, an output can be produced in the counting circuit indicative of the state of the charge of the battery. The other balls 38 can remain buoyant. When the battery charge diminishes further, the next uppermost ball can sink one ball diameter in the J-tube to rest on top of the lowermost ball and open the optical path between the middle pair of elements 40 and 41 to produce a further digital output in the counting circuit or no output, again depending on the state of the detector element 40. A further diminished battery charge may cause the next uppermost ball to sink one ball diameter and enter the space between the middle pair of elements 40 and 41, producing still another digital indication, and so on until the battery charge reaches zero, at which time all of the balls 38 may be sunk and all of the optical paths between the three pairs of detector-emitter elements blocked to indicate the zero charge condition. Many variations in the operation of the counting circuit are possible, as previously explained.

FIG. 6 illustrates a multi-cell storage battery 42 having battery charge indicators 43 individual to the separated cells and being identical in construction. The bodies 44 of indicators 43 can be molded integrally with the side wall 45 of the battery, or formed separately and attached thereto with state-of-the-art bonding material. In this connection, the electro-optical components which coact with the digital balls, as well as the balls themselves, are formed from acrylic resin to withstand sulphuric acid indefinitely. All wiring is isolated from the acid electrolyte. Good bonding and sealing of components is achieved by the use of the silicone sealant RTV-108.

Associated with each indicator unit 43 is a remote conventional binary counting circuit 46 having a display 47, such as a vehicle dashboard-mounted light or series of lights, whereby the condition of each battery cell can be automatically indicated, or can be indicated by the closing of a manual switch or switches 48.

Each body 44 contains a vertical bore 49 having a top closure plug 50 sealed therein. Two spaced stop pins 51 mounted in the body 44 extend across the bore 49 and serve to cage two balls 52 of preselected specific gravities which are either buoyant, as shown, or sunk depending upon conditions. Cross bores 53 formed through the body 44 intersect the vertical bore 49 at right angles thereto and opposing pairs of electro-optical detector-emitter elements 54 and 55 are sealed in the ends of the cross bores 53 in the manner above-described with silicone sealant.

In view of the foregoing descriptions of operation, it is thought to be unnecessary to repeat the description of operation of the units 43 in relation to their counting circuits 46. Suffice it to say that, depending on the state of the charge in each battery cell, the balls 52 will either be buoyant, as shown, or one or both balls will be sunk, and the resulting blocking or unblocking of the optical paths between the paired elements 54 and 55 will result in digital outputs and indications of the condition of each battery cell. The number of balls employed in the separate units 43 may be varied, as should now be readily understood, and specific modes of indication may likewise be varied, as explained previously in connection with FIGS. 1, 3 and 5.

A bubble barrier for each battery cell unit 43 is provided as best shown in FIG. 7. This barrier is provided by two steeply inclined bores 56 and 57 formed through the battery side wall 45 and through the body 44 so as to intersect the vertical bore 49 near the top and bottom ends thereof. Preferably, a sediment chamber 58 is provided at the bottom of bore 49 below the inclined bore or passage 56. Rising bubbles generated in the battery electrolyte 59 during charging cannot enter the electrolyte filled bore 49 through the inclined bores 56 and 57 whose outer ends are above their inner ends communicating with the bore 49. As in the prior forms of the invention, a continuous flow of electrolyte from each cell through the bore 56 and upwardly through the bore 49 and then outwardly through the bore 57 takes place due to differential pressure. This hydrodynamic action greatly increases the sensitivity of response of the indicator means in comparison to hydrostatic systems as discussed previously and the problem of bubble clogging within the bore 49 is completely eliminated by the U-shaped electrolyte flow path. The same advantages present in the previously-described embodiments are also present in the embodiment of FIGS. 6 and 7. Bore 57 is always below the electrolyte level so it is always filled.

FIG. 8 depicts a form of battery condition indicator constructed for direct visual reading without the necessity for the counting circuit 46 or any electro-optical components. In this figure, a transparent vertical sight tube 60 mounted external to a battery side wall 61 has its top and bottom ends sealed to blocks 62 and 63 which are either attached to the wall 61 or molded integrally therewith. The tube 60 communicates with the interior of the battery and receives a continuous flow of battery electrolyte 64 through two steeply inclined bubble-excluding passages 65 and 66 near the top and bottom ends of the sight tube.

Two balls 67 of precise specific gravities are placed within the tube 60, between two stop pins 68 near the top and bottom of the tube. The two balls are either buoyant or sunk, as shown, to indicate the condition of the charge on the battery at any given time. The condition of charge is obtained by direct viewing of the balls 67 through the sight tube 60. In the illustrated arrangement, the balls move a distance equal to two ball diameters instead of one between their buoyant and sunk positions. As the specific gravities of the two balls are different, the sinking of the lower ball can indicate a partial loss of charge in the battery, such as a one-half charge, and the sinking of both balls could indicate a complete loss of charge. When both balls are buoyant, a full battery charge could be indicated.

FIGS. 9 and 10 show yet another embodiment of the invention in which two cells 69 and 70 of a battery 71 share a battery condition indicator 72 in accordance with the invention. Again, the indicator 72 includes a block or body 73 integral with or mounted on a battery wall 74 and having two parallel vertical bores 75, one for each cell 69 and 70, and communicating therewith by means of two steeply inclined convergent passages 76 and 77 which intersect the vertical bore 75. These passages form a means of excluding bubbles from the vertical bore 75 and enable a continuous flow of electrolyte in the direction shown by the arrows in FIG. 10 during charging of the battery.

A single stop pin 78 across the vertical bore 75 between the inclined passages 76 and 77 limits downward movement of a single ball 79 when the ball sinks. The lower tip of a vertical stop pin 80 within the bore 75 limits upward movement of the ball in the buoyant state. The vertical stop pin 80 is secured dependingly to a top vented closure plug 81 for the bore 75. Since the plug 81 has a vent opening 82, any bubbles which might enter the bore 75 through the upper passage 77 at any time will be harmless and cannot produce clogging of the bore 75, as they will simply rise to the electrolyte surface 83 and become dissipated. No bubbles can enter the vertical bore 75 through the inclined passage 76.

As best shown in FIG. 9, the unit 72 common to two battery cells is equipped by opposing axially aligned electrooptical detector and emitter elements 84 and 85 connected by wiring to a remote binary counting circuit, such as one of the circuits 46, not shown. The elements 84 and 85 are sealed within a cross bore 86 of the block 73 which intersects both vertical bores 75 at right angles, with an intervening light pipe 87 disposed between the two vertical bores, thus enabling the two vertical bores to share a single pair of detector-emitter elements. The single ball 79 in each vertical bore 75 travels only one ball diameter in the illustrated embodiment between its buoyant and sunk positions shown in full lines and dotted lines, respectively, in the drawings. In the sunk position, the balls 79 block the light path between the elements 84 and 86 while in the buoyant positions, the balls are clear of the light path. One ball in one bore 75 may be sunk while the other ball 79 in the other bore 75 remains buoyant, depending upon the specific gravity of the electrolyte in each separate battery cell and therefore the state of the charge of each cell. The common indicator unit 72 will produce a digital indication that at least one of the two cells is bad, or that both cells are bad or both are good. This latter situation could be indicated when both balls 79 are buoyant. The mode of operation of each dual cell unit 75 is essentially the same as the modes of operation described for previous embodiments. In FIGS. 9 and 10, the balls move exactly one ball diameter between their buoyant and sunk positions.

It is to be understood that, while not shown, a single pair of detector-emitter elements can serve more than two vertical bores and thus more than two cells. In such case, a separate intervening light pipe 87 is disposed between each of the adjacent bores 75 in the same manner as shown in FIG. 9. The light from the emitter will thus be transmitted through two or more light pipes 87 before the optical path is completed to the detector.

The removable closure plugs 81 also allow the ball or balls to be placed in the bores 75 after the battery is filled with electrolyte in the battery activation stage, so that all trapped air is purged from the flow through system before the balls are inserted therein.

FIG. 11 shows a slight variation of the device in FIGS. 9 and 10 and differs from the latter only in the relative locations of the two lower stop pins 88 and the lower tips of the two vertical stop pins 89. All other components remain unchanged and are designated by the same numerals employed in FIGS. 9 and 10.

More particularly, in FIG. 11, the stop pins 88 and 89 are positioned within the two bores 75 in such a manner that when the balls 79 are buoyant, as shown in full lines, they are blocking the light path between the elements 84 and 85, and when sunk, as shown in dotted lines, the balls are below the light path and thus do not interrupt it. This is the reverse of the arrangement shown in FIG. 9 with respect to the two positions of the balls, which in both cases move one ball diameter. The same general mode of operation for the indicator already fully described prevails and remains essentially unchanged in FIG. 11.

The terms and expressions which have been employed herein are used as terms of description and not of limitation, and there is no intention, in the use of such terms and expressions, of excluding any equivalents of the features shown and described or portions thereof but it is recognized that various modifications are possible within the scope of the invention claimed.

I claim

1. A battery condition indicator comprising a body having a substantially vertical passage at least a lateral passage near the lower end of the vertical passage communicating with the vertical passage and having a substantially upwardly opening inlet at an elevation above the point of communication of the lateral passage with the vertical passage, said vertical passage having an upper circulating opening below the level of the battery electrolyte, whereby battery electrolyte can continuously enter the lateral passage and continuously flow upwardly during charging through the vertical passage and out of the upper circulating opening due to differential pressure between the inlet and the upper circulating opening, maintaining both passages filled while electrolyte bubbles are barred from entering the lateral passage, and at least a movable element within said vertical passage submerged in battery electrolyte flowing continuously in the vertical passage and having a predetermined specific gravity whereby the element is buoyant or sunk in the vertical passage responsive to minute variations in the specific gravity of the electrolyte, and spaced stop elements within the vertical passage engageable with the movable element to position the movable element in the vertical passage in its buoyant or sunk positions.

2. A battery condition indicator as defined in claim 1, and at least one pair of coacting electro-optical components positioned on opposite sides of the vertical passage in coaxial relationship and being connected in a counting circuit means, and the movable element in one position contacting one stop element blocking an optical path between said components and in the other position contacting the other stop element rendering the optical path unobstructed.

3. A battery condition indicator as defined in claim 2, and the movement distance of the movable element between its points of contact with the spaced stop elements being at least the width of the movable element along the axis of the vertical passage or a multiple of such width whereby the counting circuit means is enabled to have digital outputs in response to movements of the movable element into and out of blocking relationship to said optical path.

4. A battery condition indicator as defined in claim 2, and plural pairs of electro-optical components on opposite sides of the vertical passage with the pairs spaced apart equidistantly along the axis of the vertical passage, and plural equally sized movable elements within the vertical passage and each having a predetermined specific gravity, whereby each element is buoyant or sunk in the battery electrolyte responsive to changes in specific gravity of the electrolyte, and said stop elements being spaced apart in the vertical passage a distance equal to the collective widths of the movable elements along the axis of the vertical passage plus the width of at least one movable element or a multiple of such width.

5. A battery condition indicator as defined in claim 2, and said body having two parallel vertical passages, one for each of two adjacent cells of the battery, each vertical passage having at least a lateral passage near its lower end in communication with the interior of one battery cell and being inclined at a sufficiently steep angle to prevent the movement of bubbles in the battery electrolyte from entering the lower portion of the vertical passage during the continuous flow of electrolyte upwardly through the passage, said movable element being within each vertical passage and each vertical passage having said spaced stop elements, and said pair of coacting electro-optical components being disposed in a bore of said body perpendicular to, intersecting and crossing said vertical passages and being common to the two adjacent battery cells, and a light pipe means in said body between the vertical passages in coaxial relationship with said electro-optical components.

6. A battery condition indicator as defined in claim 5, wherein the topmost stop elements are vertically extending stop pins within said vertical passages, and vented closure plugs for the tops of the vertical passages dependingly supporting said topmost stop elements, and each vertical passage having another lateral passage above the level of the movable element when the movable element is buoyant and in contact with the lower end of the topmost stop element, and the last-named lateral passage being in communication with the interior of one battery cell.

7. A battery condition indicator as defined in claim 1, and said body being joined to a wall of a storage battery and being disposed exteriorly of said wall adjacent to at least a cell of the storage battery, said lateral passage extending through said battery wall and said substantially upwardly opening inlet thereof communicating with said cell, and said upper circulating opening including another lateral passage for electrolyte near the top of said body and leading from the vertical passage and being formed through said battery wall and communicating with said cell below the level of the battery electrolyte to enable continuous flow of the electrolyte from the cell to the vertical passage and upwardly therethrough and back into said cell during charging due to differential pressure between the openings of the lateral passages in the battery cell.

8. A battery condition indicator as defined in claim 7, and said vertical passage having at least a transparent wall portion whereby the position of the movable element can be directly viewed through the transparent wall portion.

9. A battery condition indicator as defined in claim 8, and at least a pair of movable elements having different specific gravities within the vertical passage and being viewable through the transparent wall portion and having a movement distance between the stop elements of at least twice the width of one movable element along the axis of the vertical passage between said buoyant and sunk positions.

10. A battery condition indicator comprising an open-ended J-tube body completely submerged in battery eletrotype having a substantially vertical passage forming the long branch of the J-tube and at least a lateral passage near the lower end of the vertical passage communicating with the vertical passage and having an inlet at an elevation above the point of communication of the lateral passage with the vertical passage, whereby battery electrolyte can continuously enter the lateral passage and continuously flow upwardly during charging through the vertical passage maintaining both passages filled while electrolyte bubbles are barred from entering the lateral passage, and at least a movable element within said vertical passage submerged in battery electrolyte flowing continuously in the vertical passage and having a predetermined specific gravity whereby the element is buoyant or sunk in the vertical passage responsive to minute variations in the specific gravity of the electrolyte, and spaced stop elements within the vertical passage engageable with the movable element to position the movable element in the vertical passage in its buoyant or sunk positions.

11. A battery condition indicator as defined in claim 10, and the J-tube having a bore which includes the vertical passage, and the movable element comprising a ball.

12. A battery condition indicator comprising a tethered body adapted to be suspended removably into the electrolyte bath of a large battery, having a substantially vertical passage and at least a lateral passage near the lower end of the vertical passage communicating with the vertical passage and having an inlet at an elevation above the point of communication of the lateral passage with the vertical passage, said vertical passage opening through the top of said body, whereby battery electrolyte can continuously enter the lateral passage and continuously flow upwardly during charging through the vertical passage while the body is submerged in the battery electrolyte maintaining both passages filled while electrolyte bubbles are barred from entering the lateral passage, and at least a movable element within said vertical passage submerged in battery electrolyte flowing continuously in the vertical passage and having a predetermined specific gravity whereby the element is buoyant or sunk in the vertical passage responsive to minute variations in the specific gravity of the electrolyte, and spaced stop elements within the vertical passage engageable with the movable element to position the movable element in the vertical passage in its buoyant or sunk positions.

* * * * *